(12) United States Patent
Eom et al.

(10) Patent No.: US 10,665,570 B2
(45) Date of Patent: May 26, 2020

(54) STACK PACKAGES INCLUDING THROUGH MOLD VIAS

(71) Applicant: SK hynix Inc., Icheon-si, Gyeonggi-do (KR)

(72) Inventors: Juil Eom, Guri-si (KR); Jae Hoon Lee, Icheon-si (KR); Bok Kyu Choi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/183,556

(22) Filed: Nov. 7, 2018

(65) Prior Publication Data
US 2019/0333894 A1 Oct. 31, 2019

(30) Foreign Application Priority Data
Apr. 30, 2018 (KR) ........................ 10-2018-0050266

(51) Int. Cl.
*H01L 25/065* (2006.01)
*H01L 23/498* (2006.01)

(52) U.S. Cl.
CPC .... *H01L 25/0657* (2013.01); *H01L 23/49838* (2013.01); *H01L 2225/06548* (2013.01); *H01L 2225/06572* (2013.01)

(58) Field of Classification Search
CPC ................. H01L 25/0657; H01L 23/49838
See application file for complete search history.

(56) References Cited

U.S. PATENT DOCUMENTS

| | | | | |
|---|---|---|---|---|
| 7,713,788 B2* | 5/2010 | Ko | ...................... | H01L 23/3128 257/E21.499 |
| 9,177,832 B2* | 11/2015 | Camacho | .............. | H01L 21/561 |
| 2009/0001602 A1* | 1/2009 | Chung | ................... | H01L 24/94 257/777 |

(Continued)

FOREIGN PATENT DOCUMENTS

| | | | |
|---|---|---|---|
| KR | 100914977 B1 | 9/2009 |
| KR | 101394203 B1 | 5/2014 |

OTHER PUBLICATIONS

"Package on Package", EESemi; Feb. 22, 2017, www.eesemi.com/pop.htm (Year: 2017).*

*Primary Examiner* — Joseph C. Nicely
(74) *Attorney, Agent, or Firm* — William Park & Associates Ltd.

(57) ABSTRACT

A stack package includes a first sub-package and a second sub-package stacked on the first sub-package. The first sub-package includes a first semiconductor chip, a first through mold via (TMV) for connection that is spaced apart from the first semiconductor chip in an X-axis direction, a first TMV for bypass that is spaced apart from the first semiconductor chip in a Y-axis direction, and a redistribution line (RDL) pattern for connecting the first semiconductor chip to the first TMV for connection. The second sub-package includes a second semiconductor chip, a second TMV for connection that is spaced apart from the second semiconductor chip in the Y-axis direction, and another RDL pattern for connecting the second semiconductor chip to the second TMV for connection. The second sub-package stacked is stacked on the first sub-package such that the second TMV for connection is connected to the first TMV for bypass.

19 Claims, 14 Drawing Sheets

(56) References Cited

U.S. PATENT DOCUMENTS

| | | | |
|---|---|---|---|
| 2013/0069222 A1* | 3/2013 | Camacho | H01L 23/49827 |
| | | | 257/737 |
| 2013/0161826 A1* | 6/2013 | Son | H01L 23/481 |
| | | | 257/774 |
| 2017/0117263 A1* | 4/2017 | Yeh | H01L 21/486 |
| 2018/0145060 A1* | 5/2018 | Appelt | H01L 25/0652 |
| 2019/0319009 A1* | 10/2019 | Sung | H01L 24/24 |
| 2019/0333899 A1* | 10/2019 | Eom | H01L 23/5389 |

* cited by examiner

STACK PACKAGES INCLUDING THROUGH MOLD VIAS

CROSS-REFERENCE TO RELATED APPLICATIONS

The present application claims priority under 35 U.S.C. § 119(a) to Korean Application No. 10-2018-0050266, filed on Apr. 30, 2018, which is incorporated herein by references in its entirety.

BACKGROUND

1. Technical Field

The present disclosure relates to semiconductor package technologies and, more particularly, to stack packages including through mold via (TMV) structures.

2. Related Art

Recently, semiconductor packages having a high density and operating at a high speed have been required in various electronic systems. In response to such a demand, much effort has been focused on increasing band width of semiconductor packages with a plurality of channels. In addition, the semiconductor packages have been developed to have a relatively small form factor. Therefore, a plurality of semiconductor chips may be vertically stacked to realize compact semiconductor packages having a large storage capacity.

SUMMARY

According to an embodiment, a stack package includes a package substrate, a first sub-package stacked on the package substrate, a second sub-package stacked on the first sub-package opposite to the package substrate, and a third sub-package stacked on the second sub-package opposite to the first sub-package. The package substrate has a first surface to which a first outer connector and a second outer connector are attached. The first sub-package is stacked on a second surface of the package substrate opposite to the first and second outer connectors. The first sub-package includes a first semiconductor chip, a first through mold via (TMV) for connection that is spaced apart from the first semiconductor chip in an X-axis direction and that is connected to the first outer connector through the package substrate, a first TMV for bypass that is spaced apart from the first semiconductor chip in a Y-axis direction and that is connected to the second outer connector through the package substrate, and a first redistribution line (RDL) pattern for connecting the first semiconductor chip to the first TMV for connection. The second sub-package includes a second semiconductor chip, a second TMV for bypass that is spaced apart from the second semiconductor chip in a Y-axis direction and that is connected to the first TMV for bypass, and a second RDL pattern for connecting the second semiconductor chip to the first TMV for connection. The third sub-package includes a third semiconductor chip and a third RDL pattern for connecting the third semiconductor chip to the second TMV for bypass.

According to another embodiment, a stack package includes a package substrate, a first sub-package stacked on the package substrate, and a third sub-package stacked over the first sub-package opposite to the package substrate. The package substrate has a first surface to which a first outer connector and a second outer connector are attached. The first sub-package is stacked on a second surface of the package substrate opposite to the first and second outer connectors. The first sub-package includes a first semiconductor chip, a first through mold via (TMV) for bypass that is spaced apart from the first semiconductor chip in a Y-axis direction and that is connected to the second outer connector through the package substrate, and a first redistribution line (RDL) pattern for connecting the first semiconductor chip to the first outer connector though the package substrate. The third sub-package includes a third semiconductor chip and a third RDL pattern for connecting the third semiconductor chip to the first TMV for bypass.

According to yet another embodiment, a stack package includes a package substrate, a first sub-package stacked on the package substrate, a second sub-package stacked on the first sub-package opposite to the package substrate, and a third sub-package stacked on the second sub-package opposite to the first sub-package. The package substrate has a first surface to which a first outer connector and a second outer connector are attached. The first sub-package is stacked on a second surface of the package substrate opposite to the first and second outer connectors. The first sub-package includes a first semiconductor chip, a mold layer covering side surfaces of the first semiconductor chip and having a second surface that reveals a first surface of the first semiconductor chip facing the same direction as the second surface of the package substrate, a first through mold via (TMV) for connection that is spaced apart from the first semiconductor chip in an X-axis direction and that penetrates the mold layer to connect with the first outer connector through the package substrate, a first TMV for bypass that is spaced apart from the first semiconductor chip in a Y-axis direction and that penetrates the mold layer to connect with the second outer connector through the package substrate, and a first redistribution line (RDL) pattern that extends from the second surface of the mold layer onto the first surface of the first semiconductor chip to connect the first semiconductor chip to the first TMV for connection. The second sub-package includes a second semiconductor chip, a second TMV for bypass that is spaced apart from the second semiconductor chip in the Y-axis direction and that is connected to the first TMV for bypass, and a second RDL pattern for connecting the second semiconductor chip to the first TMV for connection. The third sub-package includes a third semiconductor chip and a third RDL pattern for connecting the third semiconductor chip to the second TMV for bypass.

DETAILED DESCRIPTION OF THE EMBODIMENTS

Figure 1:
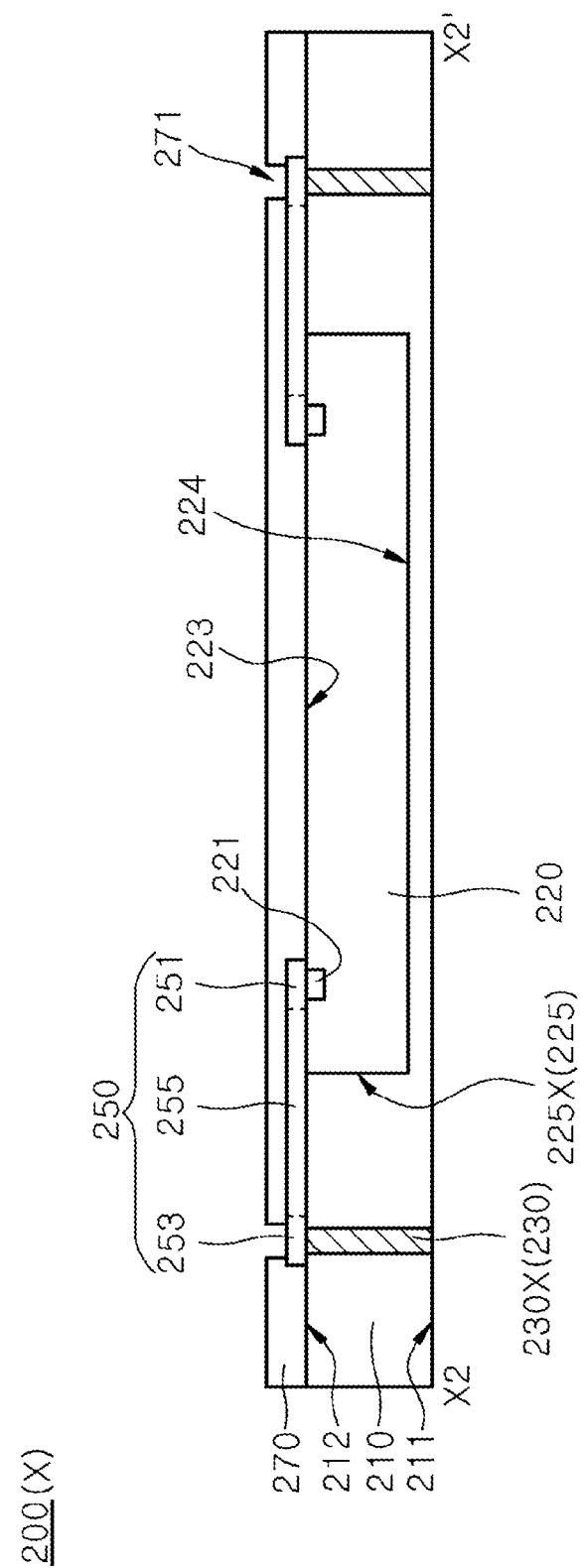
FIGS. 1 to 4 illustrate an example of a first sub-package employed in a stack package, according to an embodiment.

Terms used herein may correspond to words selected in consideration of their functions in various embodiments, and the meanings of the terms may be construed to be different according to one of ordinary skill in the art to which the embodiments belong. If defined, the terms are to be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element and not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom," and the like, may be used to describe an element and/or a feature thereof in relationship to another element(s) and/or feature(s) thereof, for example, as illustrated in the figures. It will be understood that the spatially relative terms are intended to encompass different orientations of a device in use and/or operation in addition to the orientation depicted in the figures. For example, when a device in the figures is turned over, elements described as below and/or beneath other elements or features would then be oriented above the other elements or features. The device may be otherwise oriented (e.g., rotated 90 degrees or at other orientations) and the spatially relative descriptors used herein should be interpreted accordingly.

The word "connected," as used herein for some embodiments, means that two components are directly coupled with one another. For example, a first component connected to a second component means the first component is contacting the second component. For other embodiments, connected components have one or more intervening components. For example, a first component is connected to a second component when the first and second components are both in contact with a common third component even though the first component is not directly contacting the second component.

A semiconductor package may include electronic devices, such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. Logic chips may include logic circuits which are integrated on the semiconductor substrate. The semiconductor package may be employed in communication systems, such as mobile phones, electronic systems associated with biotechnology or health care, or wearable electronic systems.

Like reference numbers refer to like elements throughout the specification. Even though a reference number is not mentioned or described with reference to another figure, the reference number may be mentioned or described with reference to the other figure. In addition, even though a reference number is not shown in a figure, it may be mentioned or described with reference to another figure.

Figure 2:
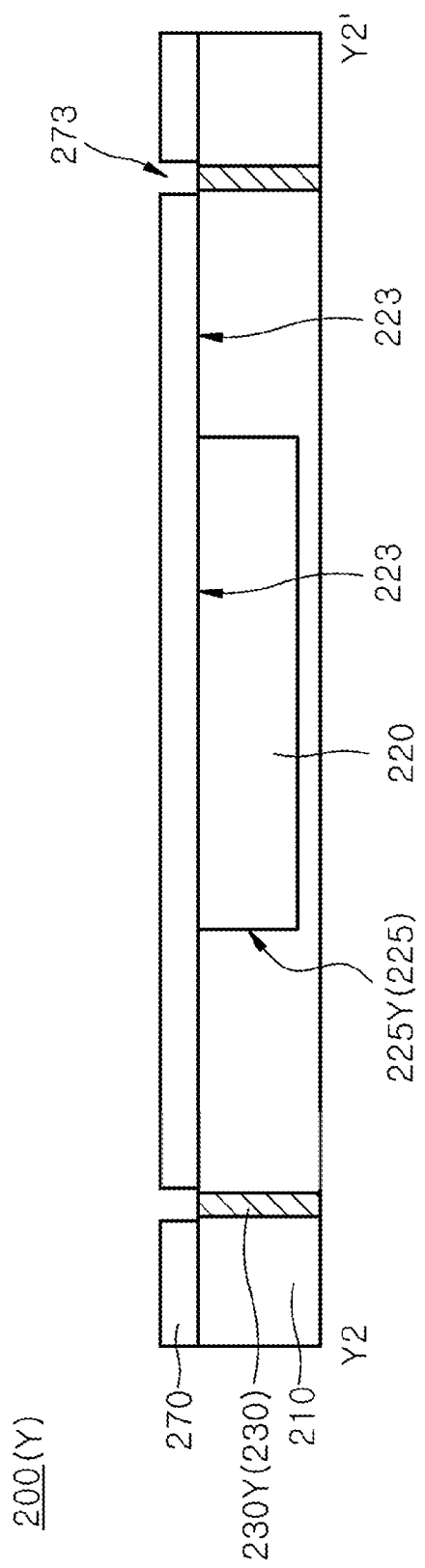
Figure 3:
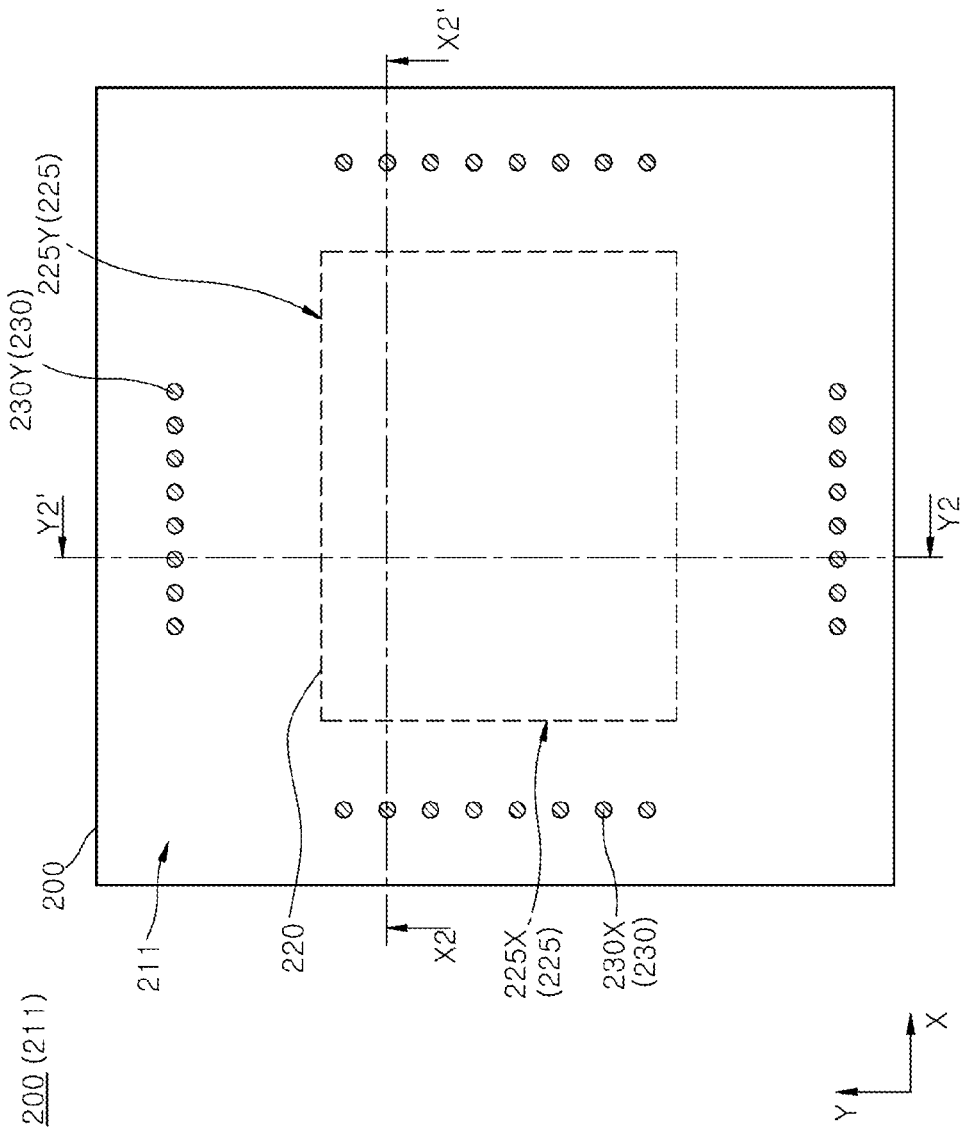
Figure 4:
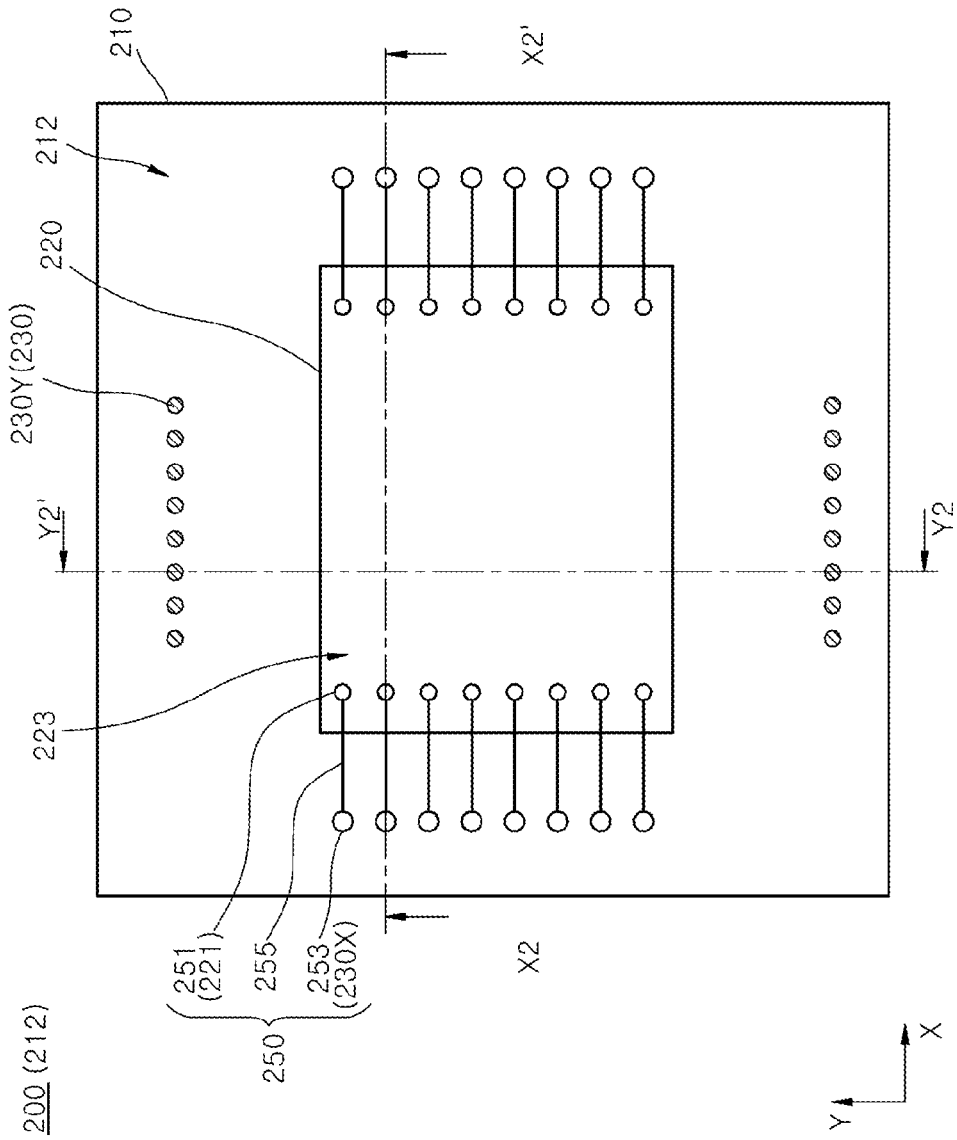

FIG. 1 shows a cross-sectional view 200(X), taken along an X-axis direction, of a first sub-package 200 employed in a stack package, according to an embodiment. FIG. 2 shows a cross-sectional view 200(Y) taken along a Y-axis direction of the first sub-package 200 illustrated in FIG. 1. The X-axis direction and the Y-axis direction denote different directions in the same plane. For example, the X-axis direction and the Y-axis direction may be perpendicular such that the X-axis and the Y-axis intersect each other at a right angle in the same plane. FIG. 3 shows a plan view 200(211) taken along a first surface 211 of a first mold layer 210 included in the first sub-package 200 illustrated in FIG. 1. FIG. 4 shows a plan view 200(212) taken along a second surface 212 of the first mold layer 210 included in the first sub-package 200 illustrated in FIG. 1. FIG. 1 shows a cross-sectional view taken along a line X2-X2' of FIGS. 3 and 4, and FIG. 2 shows a cross-sectional view taken along a line Y2-Y2' of FIGS. 3 and 4.

Referring to FIG. 1, the first sub-package 200 may be configured to include a first semiconductor chip 220 surrounded by the first mold layer 210. The first sub-package 200 may include first through mold vias (TMVs) 230 substantially penetrating the first mold layer 210. The first TMVs 230 may be conductive vias that extend from the first surface 211 of the first mold layer 210 to the second surface 212 of the first mold layer 210. The first surface 211 and the second surface 212 may be opposite to each other. In FIG. 1, the first surface 211 of the first mold layer 210 may correspond to a bottom surface of the first mold layer 210, and the second surface 212 of the first mold layer 210 may correspond to a top surface of the first mold layer 210.

The first semiconductor chip 220 may be encapsulated by the first mold layer 210 to protect the first semiconductor chip 220 from an external environment. The first mold layer 210 may be formed using at least one of various encapsulant materials. The first mold layer 210 may be formed to include an epoxy molding compound (EMC) material. A shape of the first mold layer 210 may be determined by a molding process performed using an EMC material.

The first mold layer 110 may be formed to reveal a first surface 223 of the first semiconductor chip 220 and to cover side surfaces 225 of the first semiconductor chip 220. The first mold layer 210 may extend to cover a second surface 224 of the first semiconductor chip 220. The first semiconductor chip 220 may be disposed such that the second surface 224 of the first semiconductor chip 220 is adjacent to the first surface 211 of the first mold layer 210. The first surface 223 of the first semiconductor chip 220 may be revealed and exposed at the second surface 212 of the first mold layer 210. That is, the first surface 223 of the first semiconductor chip 220 may be coplanar with the second surface 212 of the first mold layer 210. First chip pads 221 may be disposed on the first surface 223 of the first semiconductor chip 220 to function as connection terminals. The first chip pads 221 may electrically connect integrated circuits in the first semiconductor chip 220 to an external device.

Referring to FIGS. 1 and 3, the first TMVs 230 may be disposed in a periphery region (i.e., an outside region) of the first semiconductor chip 220. The first TMVs 230 may be categorized in two groups according to positions of the first TMVs 230. For example, the first TMVs 230 may be categorized as either first TMVs 230X for connection or first TMVs 230Y for bypass.

The first TMVs 230X for connection may be located at positions which are spaced apart from the first semiconductor chip 220 in the X-axis direction. The first TMVs 230X for connection may be disposed to face first side surfaces 225X included in the side surfaces 225 of the first semiconductor chip 220 in the X-axis direction. The first TMVs 230X for connection may be arrayed in columns which are parallel with the Y-axis. The first TMVs 230X for connection maybe electrically connected to the first semiconductor chip 220 embedded in the first mold layer 210.

Referring to FIGS. 2 and 3, the first TMVs 230Y for bypass may be located at positions which are spaced apart from the first semiconductor chip 220 in the Y-axis direction. The first TMVs 230Y for bypass may be disposed to face second side surfaces 225Y included in the side surfaces 225 of the first semiconductor chip 220 in the Y-axis direction. The first TMVs 230Y for bypass may be arrayed in rows which are parallel with the X-axis. The first TMVs 230Y for bypass may be electrically disconnected from the first semiconductor chip 220 embedded in the first mold layer 210. The first TMVs 230Y for bypass and the first TMVs 230X for connection may be formed to have substantially the same shape. However, the first TMVs 230Y for bypass may be electrically disconnected from the first semiconductor chip 220, unlike the first TMVs 230X for connection being electrically connected to the first semiconductor chip 220. Thus, the first TMVs 230Y for bypass may be distinct from the first TMVs 230X for connection in terms of electrical connection.

Referring to FIGS. 1 and 4, the first sub-package 200 may include first redistribution layer (RDL) patterns 250. The first RDL patterns 250 may include conductive patterns extending from the first surface 223 of the first semiconductor chip 220 onto the second surface 212 of the first mold layer 210. Specifically, each of the first RDL patterns 250 may include a first extension pattern 255 and first and second contact patterns 251 and 253, respectively, connected to opposite ends of the first extension pattern 255.

The first extension pattern 255 may extend from the first surface 223 of the first semiconductor chip 220 onto the second surface 212 of the first mold layer 210. The first contact patterns 251 of the first RDL patterns 250 may be connected to the first chip pads 221, respectively. The first contact patterns 251 may be disposed to overlap with the first chip pads 221, respectively. The second contact patterns 253 of the first RDL patterns 250 may be connected to the first TMVs 230X for connection, respectively. The second contact patterns 253 may be disposed to overlap with ends of the first TMVs 230X for connection, which are revealed at the second surface 212 of the first mold layer 210, respectively.

The first RDL patterns 250 may electrically connect the first semiconductor chip 220 to the first TMVs 230X for connection. In contrast, the first RDL patterns 250 do not electrically connect the first semiconductor chip 220 to the first TMVs 230Y for bypass. As illustrated in FIGS. 2 and 4, the first TMVs 230Y for bypass may be electrically isolated and insulated from the first semiconductor chip 220.

Referring to FIGS. 1 and 2, the first sub-package 200 may include a first dielectric layer 270 covering the first RDL patterns 250. The first dielectric layer 270 may extend to cover the first surface 223 of the first semiconductor chip 220 and the second surface 212 of the first mold layer 210. The first dielectric layer 270 may act as an insulation layer that electrically insulates the first RDL patterns 250 from each other. As illustrated in FIG. 1, the first dielectric layer 270 may have first opening holes 271 that reveal the second contact patterns 253 of the first RDL patterns 250. In addition, as illustrated in FIG. 2, the first dielectric layer 270 may further have second opening holes 273 that reveal ends of the first TMVs 230Y for bypass.

Figure 5:
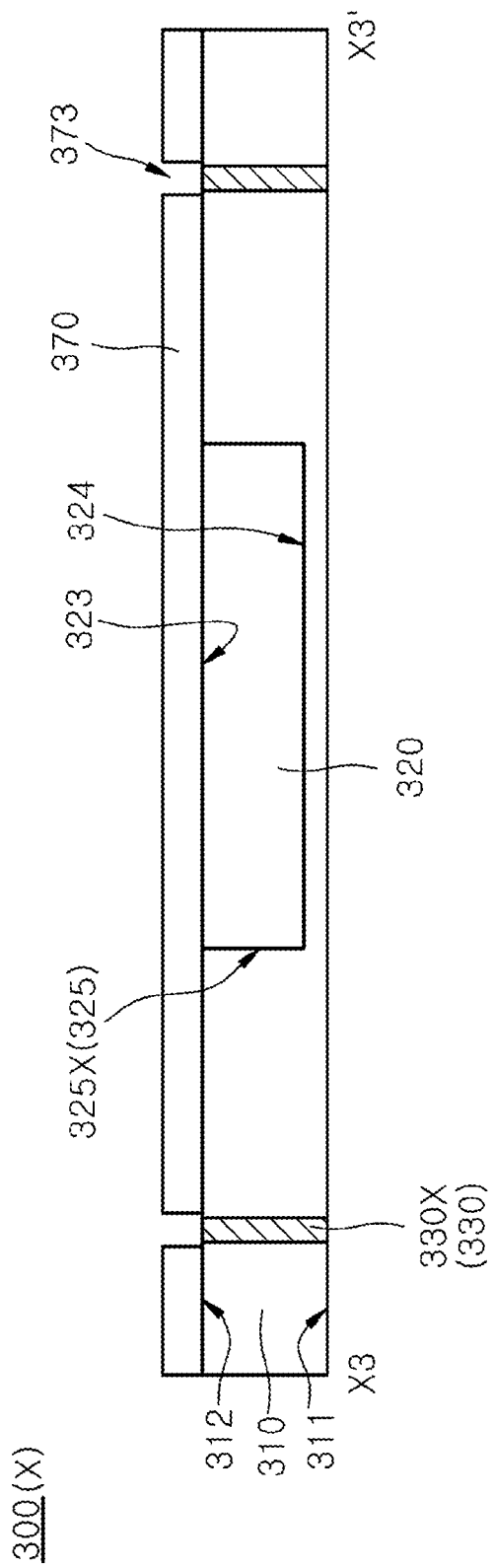
FIGS. 5 to 8 illustrate an example of a second sub-package employed in a stack package, according to an embodiment.
Figure 6:
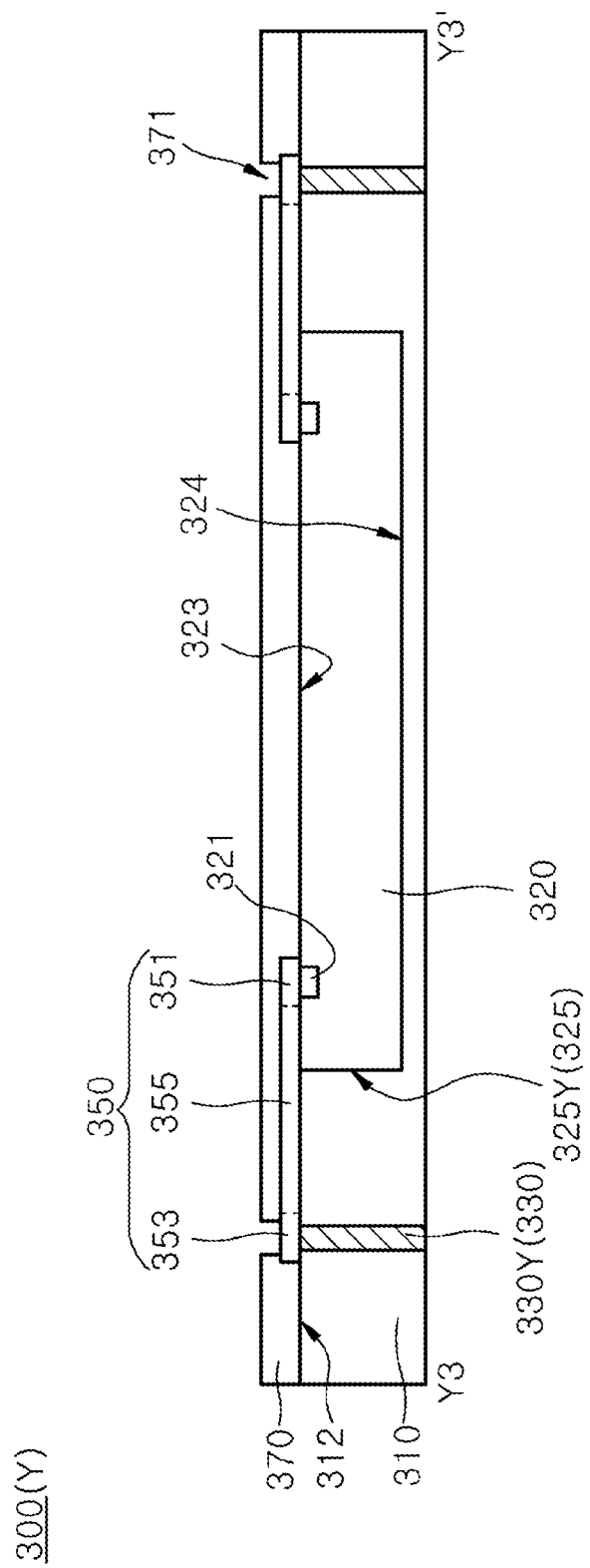
Figure 7:
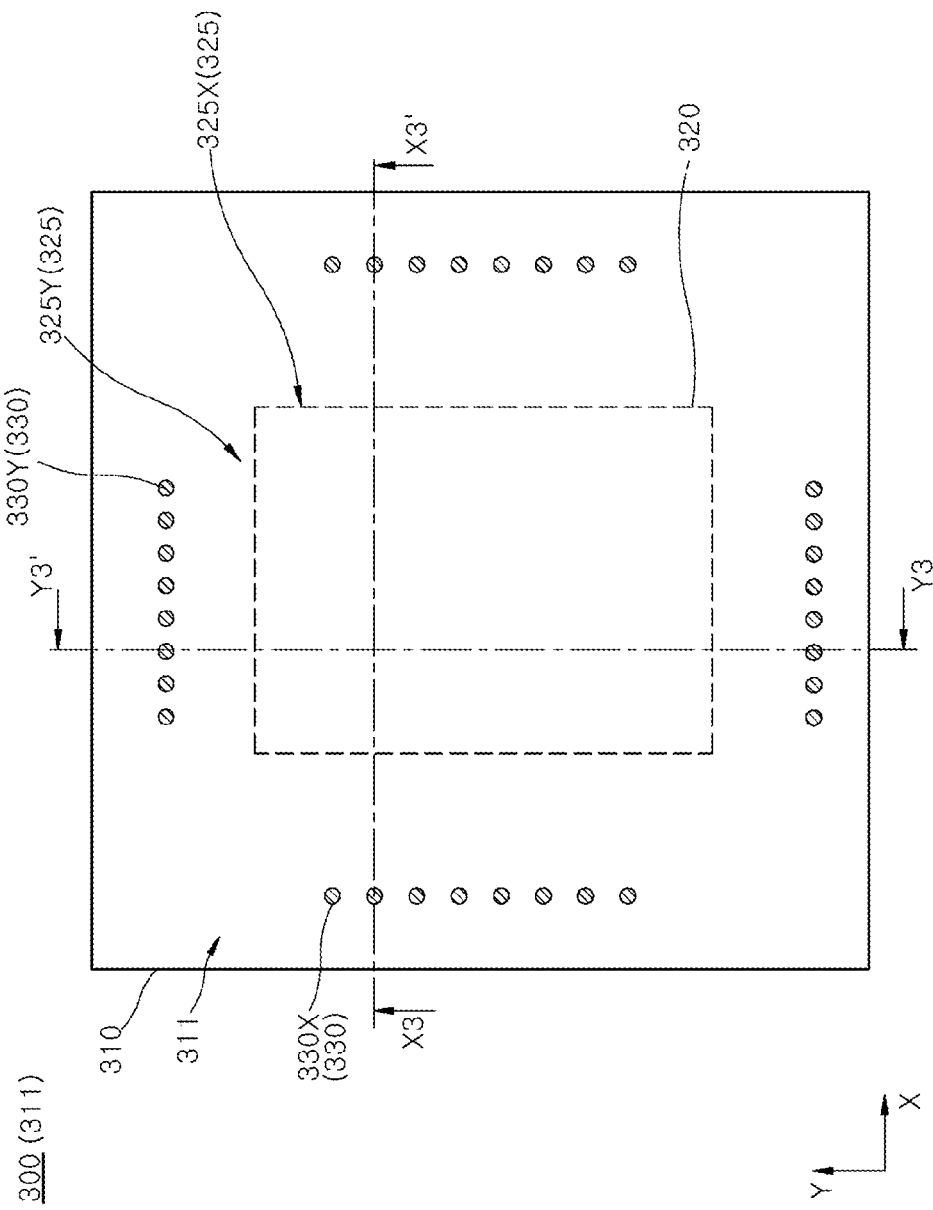
Figure 8:
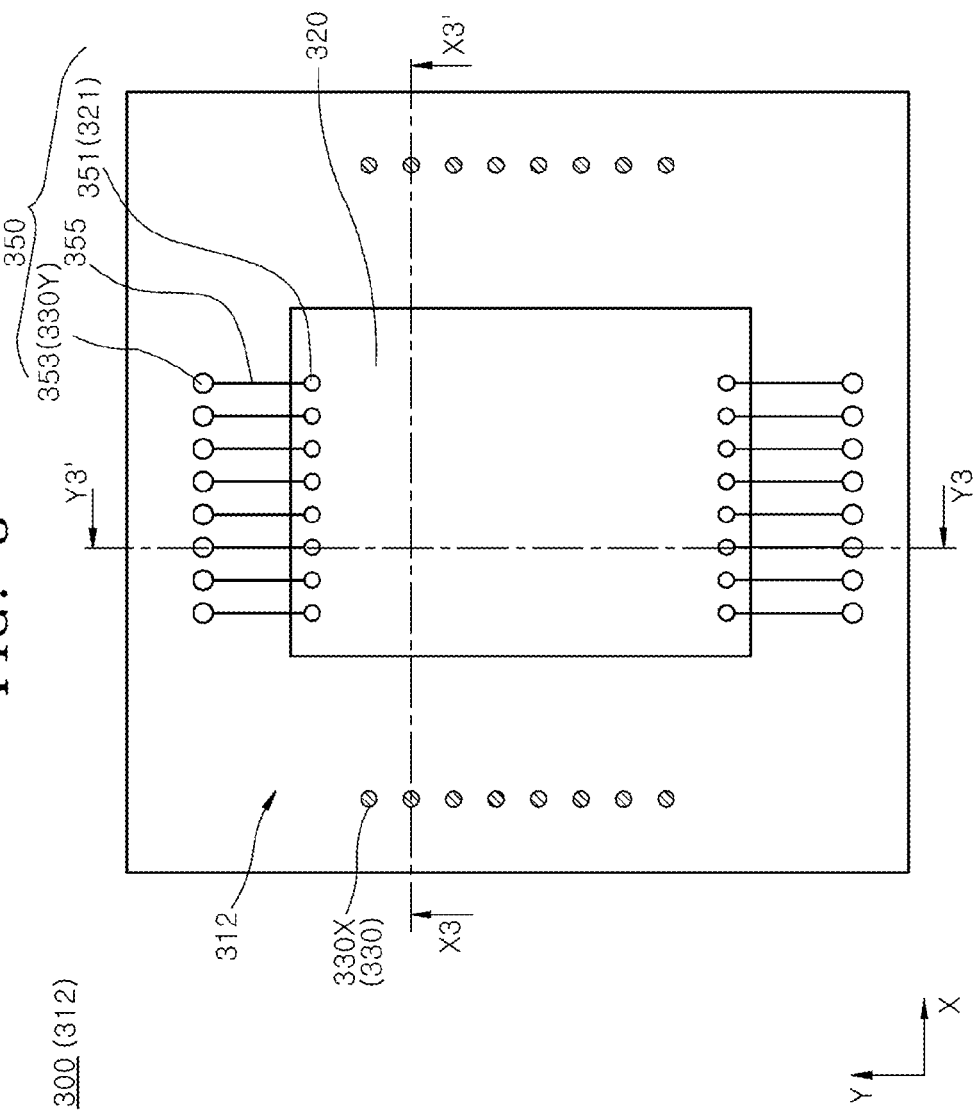

FIG. 5 shows a cross-sectional view 300(X), taken along an X-axis direction, of a third sub-package 300 employed in a stack package according to an embodiment. The third sub-package 300 may have substantially the same shape as the first sub-package 200, which is rotated 90 degrees in an X-Y plane. The terms "first" and "third" for the first sub-package 200 and the third sub-package 300, respectively, are only used to distinguish the sub-packages from one another, and not used to define the sub-package itself or to mean a particular sequence. FIG. 6 shows a cross-sectional view 300(Y) taken along a Y-axis direction of the third sub-package 300 illustrated in FIG. 5. FIG. 7 shows a plan view 300(311) taken along a first surface 311 of a third mold layer 310 included in the third sub-package 300 illustrated in FIG. 5. FIG. 8 shows a plan view 300(312) taken along a second surface 312 of the third mold layer 310 included in the third sub-package 300 illustrated in FIG. 5. FIG. 5 shows a cross-sectional view taken along a line X3-X3' parallel with the X-axis direction of FIGS. 7 and 8, and FIG. 6 show a cross-sectional view taken along a line Y3-Y3' parallel with the Y-axis direction of FIGS. 7 and 8.

Referring to FIG. 5, the third sub-package 300 may have a shape which is similar to a shape of the first sub-package (200 of FIG. 1). The third sub-package 300 may have substantially the same shape as the first sub-package 200, but is shown rotated by 90 degrees in an X-Y plane from the orientation of the first sub-package 200.

The third sub-package 300 may be configured to include a third semiconductor chip 320 surrounded by the third mold layer 310. The third sub-package 300 may include third TMVs 330 substantially penetrating the third mold layer 310. The third TMVs 330 may be conductive vias that extend from the first surface 311 of the third mold layer 310 to the second surface 312 of the third mold layer 310. The first surface 311 and the second surface 312 may be opposite to each other.

The third mold layer 310 may be formed to reveal a first surface 323 of the third semiconductor chip 320 and to cover side surfaces 325 of the third semiconductor chip 320. The third mold layer 310 may extend to cover a second surface 324 of the third semiconductor chip 320. The third semiconductor chip 320 may be disposed such that the second surface 324 of the third semiconductor chip 320 is adjacent to the first surface 311 of the third mold layer 310. The first surface 323 of the third semiconductor chip 320 may be revealed and exposed at the second surface 312 of the third mold layer 310. That is, the first surface 323 of the third semiconductor chip 320 may be coplanar with the second surface 312 of the third mold layer 310.

Referring to FIG. 6, third chip pads 321 may be disposed on the first surface 323 of the third semiconductor chip 320 to function as connection terminals. The third chip pads 321 may electrically connect integrated circuits in the third semiconductor chip 320 to an external device. The integrated circuits in the third semiconductor chip 320 may be substantially the same circuits as the integrated circuits in the first semiconductor chip 220.

Referring to FIGS. 7 and 8, the third TMVs 330 may be disposed in a periphery region (i.e., an outside region) of the third semiconductor chip 320. The third TMVs 330 may be categorized in two groups according to positions of the third TMVs 330. For example, the third TMVs 330 may be categorized as either third TMVs 330Y for connection or third TMVs 330X for bypass. The third TMVs 330Y for connection may be located at positions where the first TMVs 230X for connection are rotated by 90 degrees about a central point of the first sub-package 200 as an axis of rotation, in an X-Y plane. Similarly, the third TMVs 330X for bypass may be located at positions where the first TMVs 230Y for bypass are rotated by 90 degrees about a central point of the first sub-package 200 as an axis of rotation, in the X-Y plane. The third TMVs 330Y for connection may be disposed to vertically overlap with the first TMVs 230Y for bypass in a plan view in consideration of a case that the third sub-package 300 is stacked on the first sub-package 200. The third semiconductor chip 320 may have substantially the same shape as the first semiconductor chip 220, which is rotated by 90 degrees in the X-Y plane. In such a case, the third semiconductor chip 320 is may be stacked on the first semiconductor chip 220 to overlap the first semiconductor chip 220 at a right angle in an X-Y plane.

Referring to FIGS. 7 and 8, the third TMVs 330Y for connection may be located at positions which are spaced apart from the third semiconductor chip 320 in the Y-axis direction. The third TMVs 330Y for connection may be disposed to face second side surfaces 325Y included in the side surfaces 325 of the third semiconductor chip 320 in the Y-axis direction. The third TMVs 330Y for connection may be arrayed in rows which are parallel with the X-axis. The third TMVs 330Y for connection may be electrically connected to the third semiconductor chip 320 embedded in the third mold layer 310.

The third TMVs 330X for bypass may be located at positions which are spaced apart from the third semiconductor chip 320 in the X-axis direction. The third TMVs 330X for bypass may be disposed to face first side surfaces 325X included in the side surfaces 325 of the third semiconductor chip 320 in the X-axis direction. The third TMVs 330X for bypass may be arrayed in columns which are parallel with the Y-axis. The third TMVs 330X for bypass may be electrically disconnected from the third semiconductor chip 320 embedded in the third mold layer 310. The third TMVs 330X for bypass and the third TMVs 330Y for connection may be formed to have substantially the same shape. However, the third TMVs 330X for bypass may be electrically disconnected from the third semiconductor chip 320, unlike the third TMVs 330Y for connection, which are electrically connected to the third semiconductor chip 320. Thus, the third TMVs 330X for bypass may be distinct from the third TMVs 330Y for connection in terms of electrical connection.

Referring to FIGS. 6 and 8, the third sub-package 300 may include third redistribution layer (RDL) patterns 350. The third RDL patterns 350 may include conductive patterns extending from the first surface 323 of the third semiconductor chip 320 onto the second surface 312 of the third mold layer 310. Specifically, each of the third RDL patterns 350 may include a third extension pattern 355 and third and fourth contact patterns 351 and 353, respectively, connected to opposite ends of the third extension pattern 355.

The third extension pattern 355 may extend from the first surface 323 of the third semiconductor chip 320 onto the second surface 312 of the third mold layer 310. The third extension pattern 355 may be a conductive pattern extending in the Y-axis direction. The third contact patterns 351 of the third RDL patterns 350 may be connected to the third chip pads 321, respectively. The third contact patterns 351 may be disposed to overlap with the third chip pads 321, respectively. The fourth contact patterns 353 of the third RDL patterns 350 may be connected to the third TMVs 330Y for connection, respectively. The fourth contact patterns 353 may be disposed to overlap with ends of the third TMVs 330Y for connection, which are revealed at the second surface 312 of the third mold layer 310, respectively.

The third semiconductor chip 320 may be electrically connected to the third TMVs 330Y for connection through the third RDL patterns 350. In contrast, the third semiconductor chip 320 might not be electrically connected to the third TMVs 330X for bypass by the third RDL patterns 350. As illustrated in FIG. 5, the third TMVs 330X for bypass may be electrically isolated and insulated from the third semiconductor chip 320.

Referring to FIGS. 5 and 6, the third sub-package 300 may include a second dielectric layer 370 covering the third RDL patterns 350. The second dielectric layer 370 may extend to cover the first surface 323 of the third semiconductor chip 320 and the second surface 312 of the third mold layer 310. The second dielectric layer 370 may act as an insulation layer that electrically insulates the third RDL patterns 350 from each other. As illustrated in FIG. 6, the second dielectric layer 370 may have third opening holes 371 that reveal the fourth contact patterns 353 of the third RDL patterns 350. In addition, as illustrated in FIG. 5, the second dielectric layer 370 may further have fourth opening holes 373 that reveal ends of the third TMVs 330X for bypass.

Figure 9:
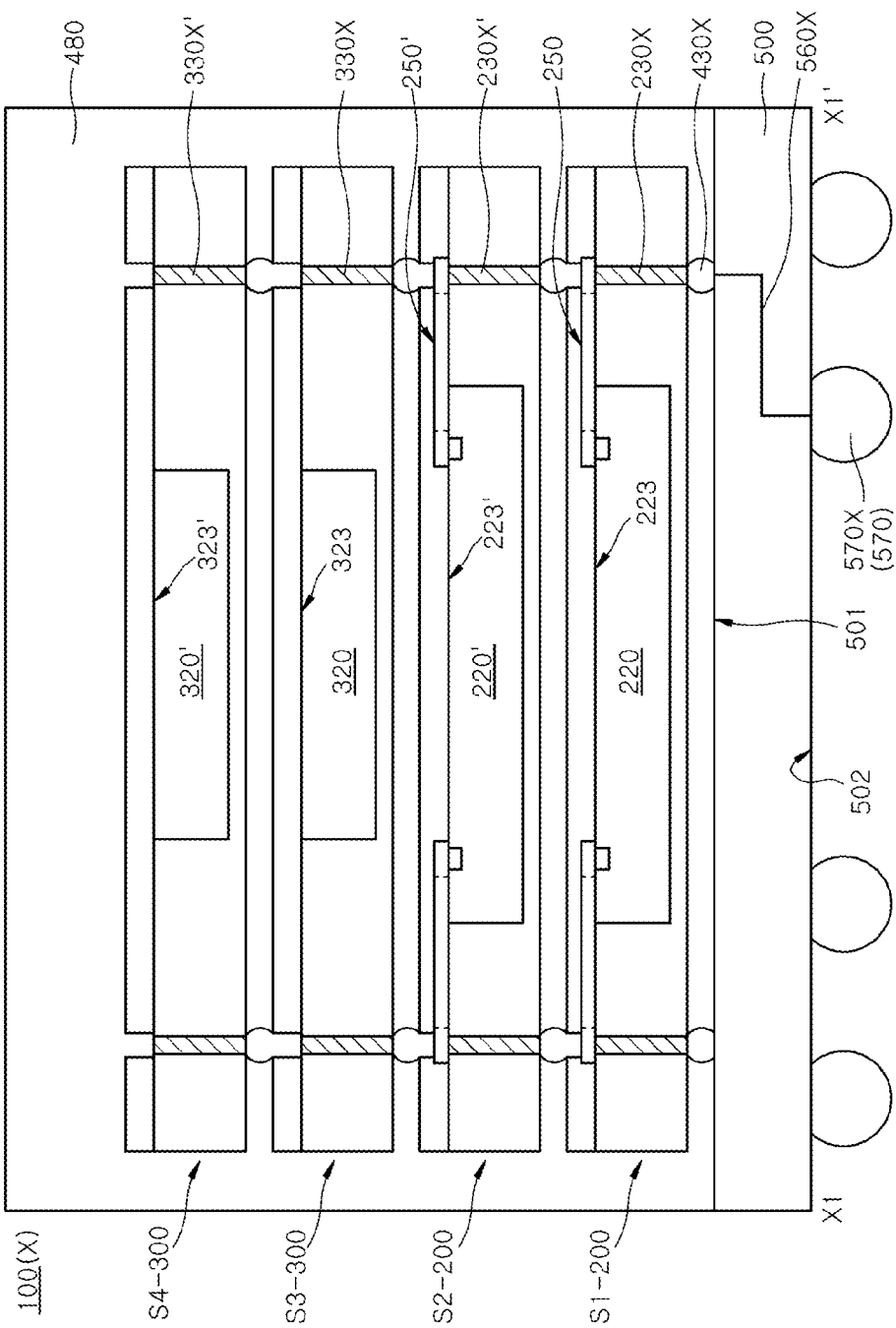
FIGS. 9 and 10 show cross sectional views illustrating a stack package, according to an embodiment.
Figure 10:
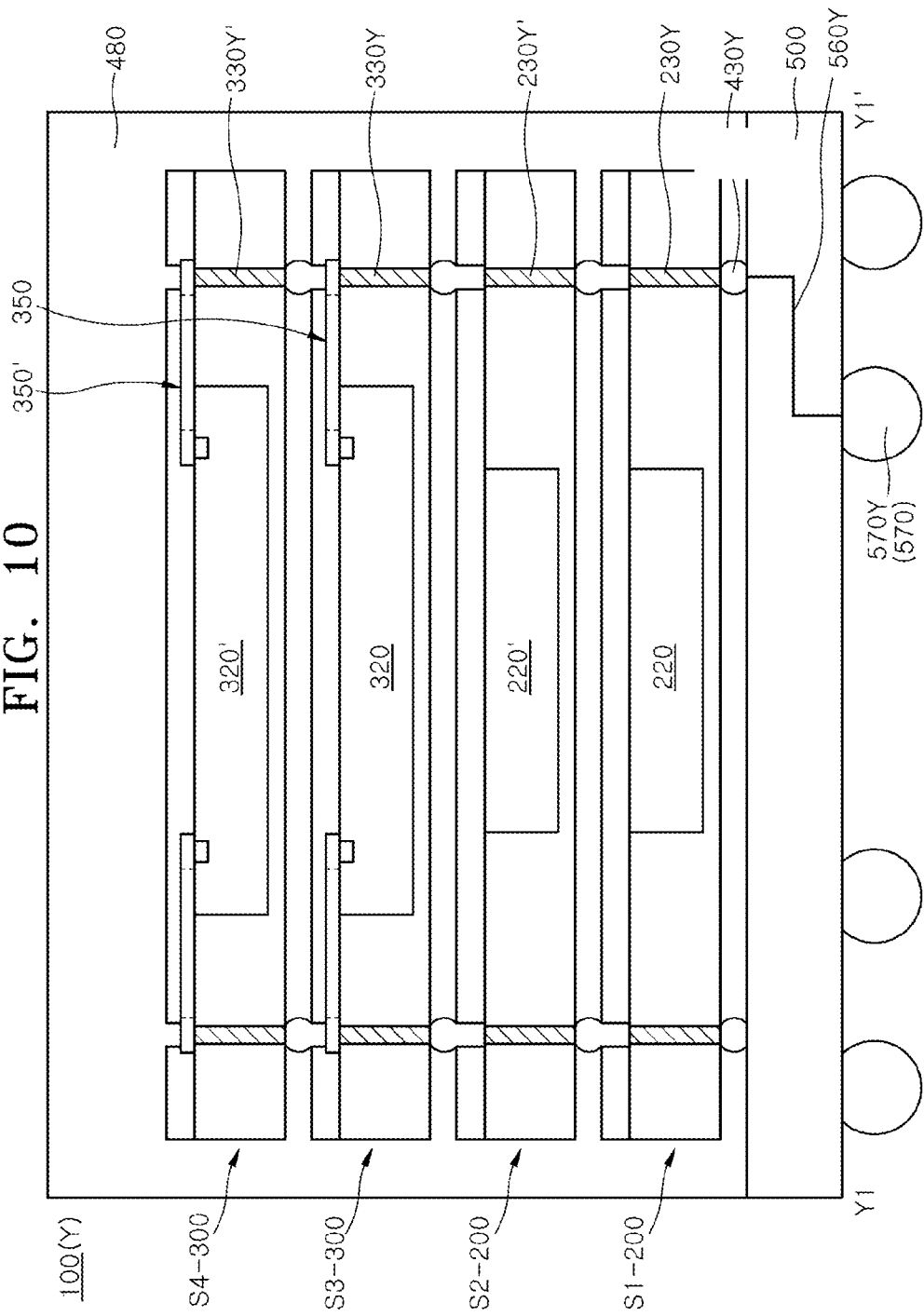
Figure 11:
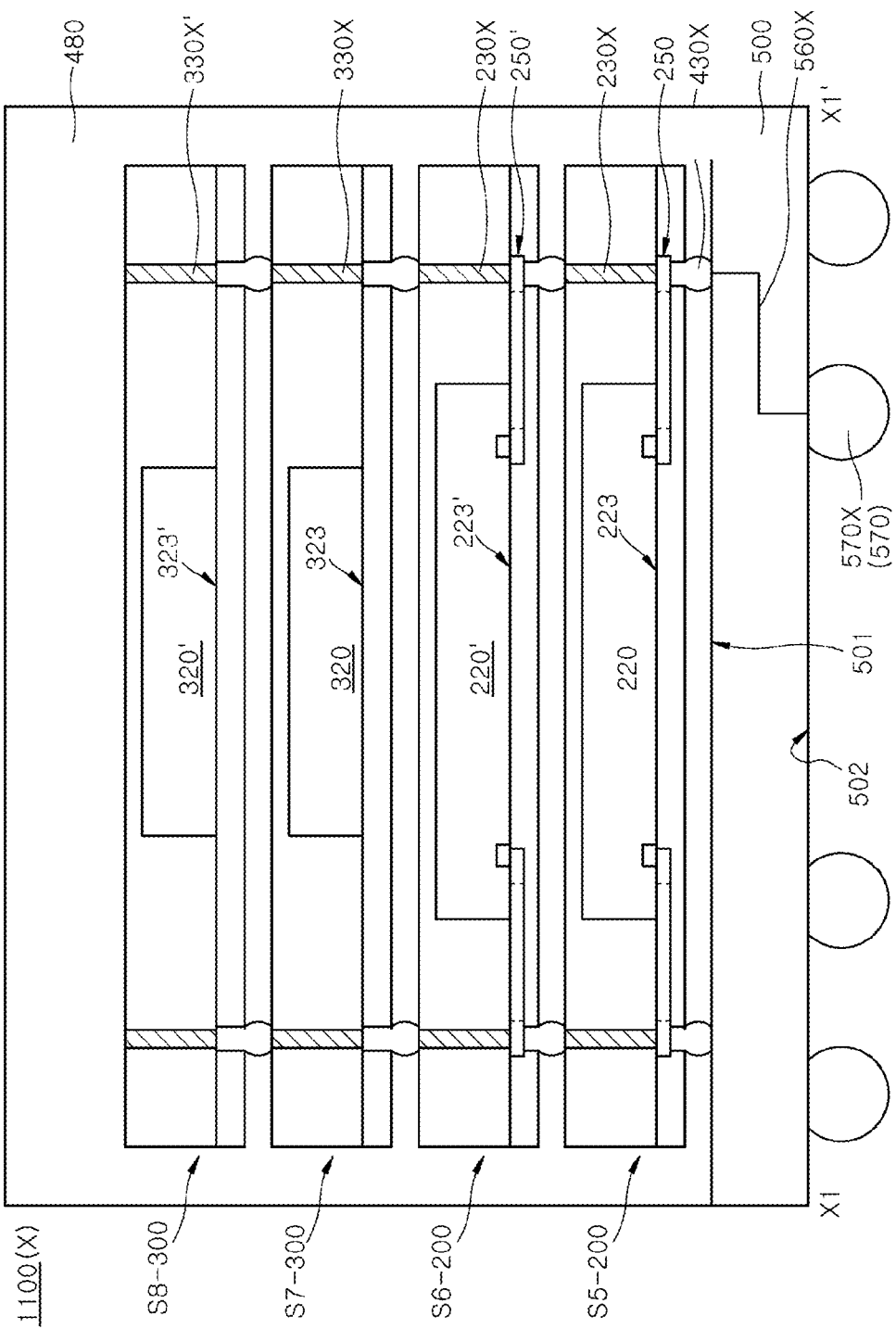
FIGS. 11 and 12 show cross sectional views illustrating a stack package, according to another embodiment.
Figure 12:
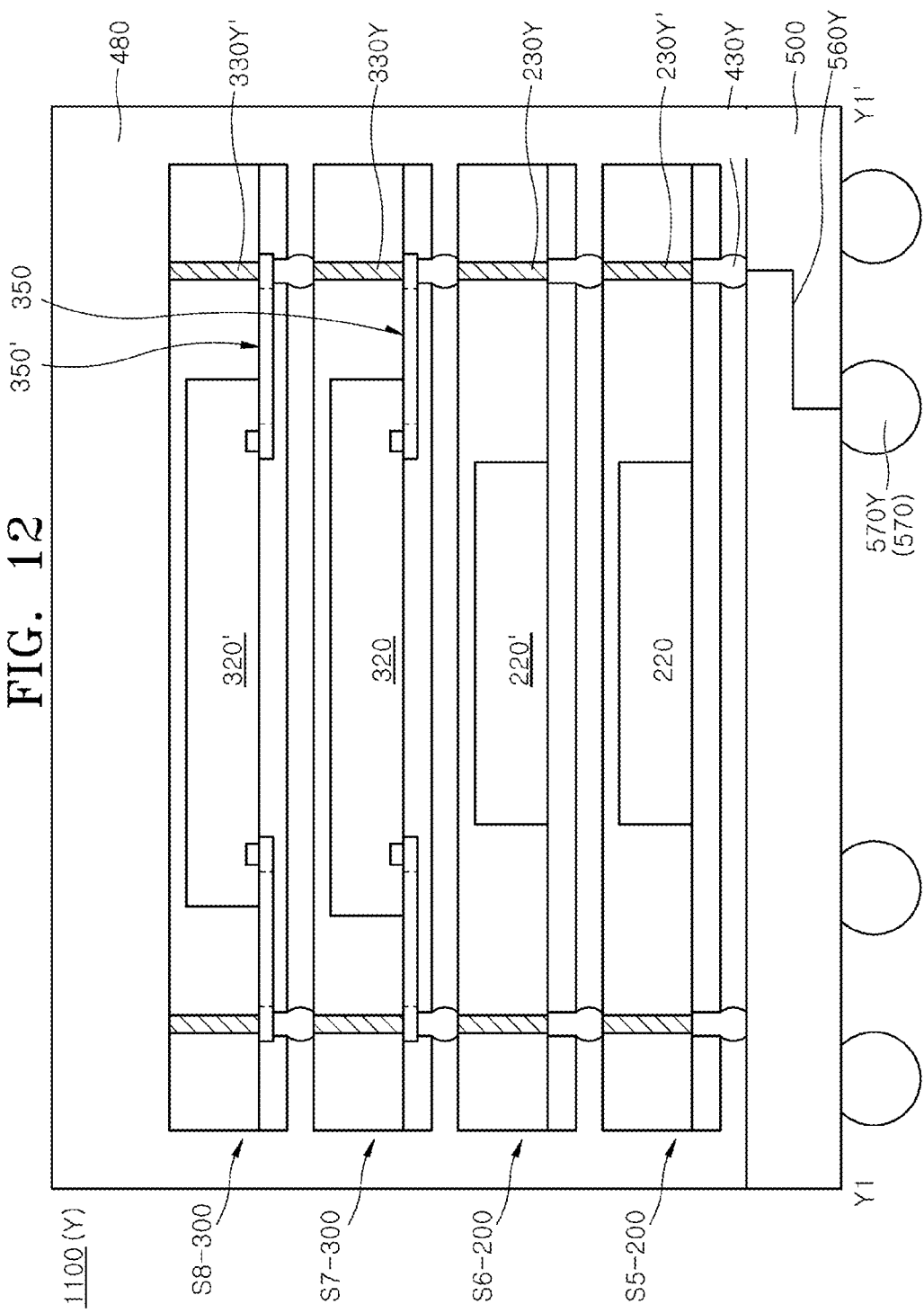
Figure 13:
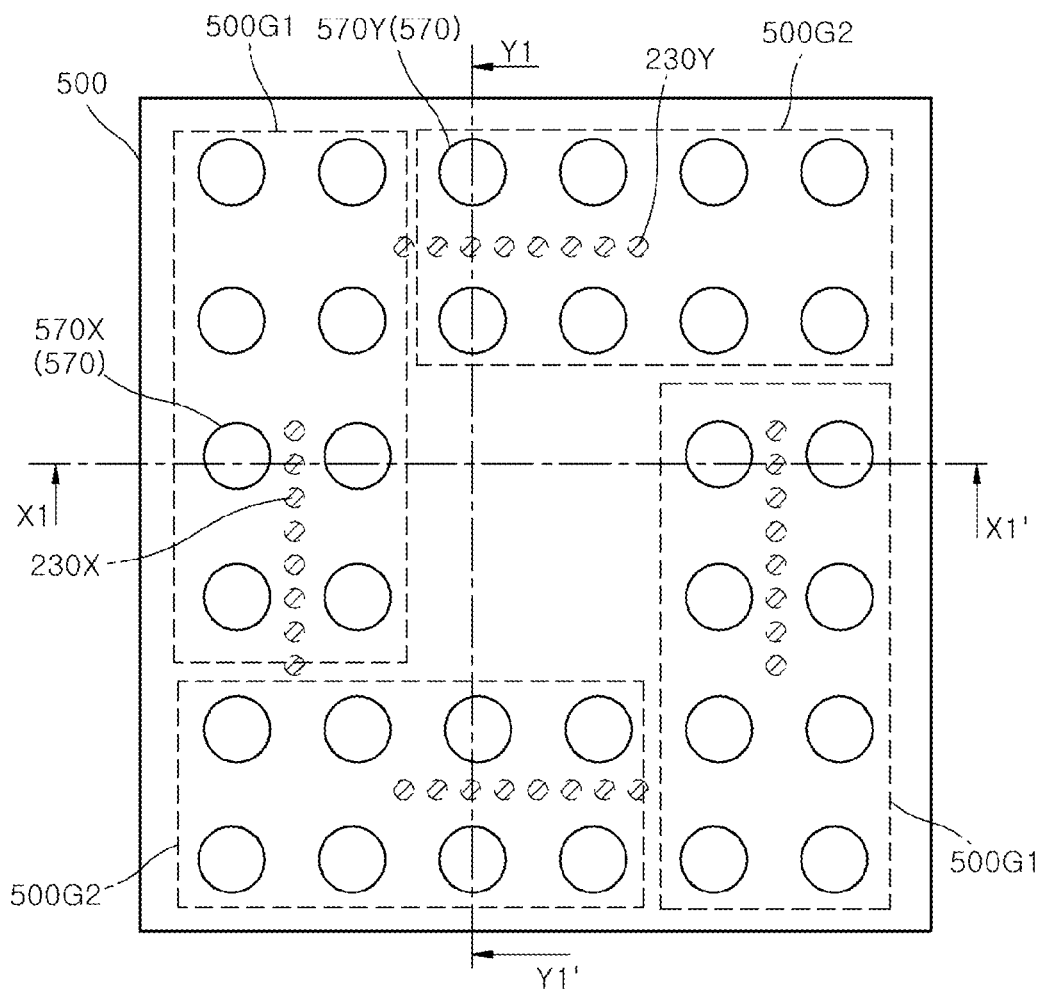
FIG. 13 shows a plan view illustrating outer connectors attached to a package substrate of a stack package, according to an embodiment.

FIGS. 9 and 10 show cross-sectional views 100(X) and 100(Y) illustrating a stack package 100, according to an embodiment. FIGS. and 12 show cross-sectional views 1100(X) and 1100(Y) illustrating a stack package 1100, according to another embodiment. FIG. 13 shows a plan view 500B illustrating an array of outer connectors 570 attached to a package substrate 500 of a stack package, according to an embodiment. FIG. 9 shows a cross-sectional view of the stack package 100 taken along a line X1-X1' (parallel with an X-axis direction) of FIG. 13, and FIG. 10 shows a cross-sectional view of the stack package 100 taken along a line Y1-Y1' (parallel with a Y-axis direction) of FIG. 13. FIG. 11 shows a cross-sectional view of the stack package 1100 taken along the line X1-X1' (parallel with the X-axis direction) of FIG. 13, and FIG. 12 shows a cross-sectional view of the stack package 1100 taken along the line Y1-Y1' (parallel with the Y-axis direction) of FIG. 13.

Referring to FIGS. 9 and 10, the stack package 100 may be configured to include the first sub-package 200, illustrated in FIGS. 1 and 2, and the third sub-package 300, illustrated in FIGS. 5 and 6, which are vertically stacked on the package substrate 500. For example, the stack package 100 may be configured to include a first stage sub-package S1-200, a second stage sub-package S2-200, a third stage sub-package S3-300 and a fourth stage sub-package S4-300, which are sequentially stacked on the package substrate 500. The first to fourth stage sub-packages S1-200, S2-200, S3-300, and S4-300 may also be referred to as a first sub-package, a second sub-package, a third sub-package, and a fourth sub-package, respectively.

Each of the first and second stage sub-packages S1-200 and S2-200 may be realized using the first sub-package 200 described with reference to FIGS. 1 to 4. Each of the third and fourth stage sub-packages S3-300 and S4-300 may be realized using the third sub-package 300 described with reference to FIGS. 5 to 8. The stack package 100 may employ the first sub-package 200 as each of the first and second stage sub-packages S1-200 and S2-200 and may employ the third sub-package 300 as each of the third and fourth stage sub-packages S3-300 and S4-300.

The package substrate 500 may have a first surface 502 to which the outer connectors 570 for electrically connecting the stack package 100 to an external device are attached. The first stage sub-package S1-200 may be stacked on a second surface 501 of the package substrate 500 opposite to the outer connectors 570. FIG. 13 may correspond to a ball map illustrating an array of solder balls acting as the outer connectors 570.

The first stage sub-package S1-200 may be electrically connected to the package substrate 500 through inner connectors 430X, 430Y. The first to fourth stage sub-packages S1-200, S2-200, S3-300, and S4-300 may be electrically connected to each other by additional inner connectors 430X, 430Y. The inner connectors 430X, 430Y may be conductive bumps. An outer mold layer 480 may be formed on the package substrate 500 and cover the first to fourth sub-packages S1-200, S2-200, S3-300, and S4-300.

Referring to FIG. 9, the first TMVs 230X for connection may be electrically connected to the first semiconductor chip 220 in the first stage sub-package S1-200 through the first RDL patterns 250. That is, the first TMVs 230X for connection and the first RDL patterns 250 may act as connection paths of the first semiconductor chip 220.

Second TMVs 230X' for connection of the second stage sub-package S2-200 may be electrically connected to the first TMVs 230X for connection of the first stage sub-package S1-200 located below the second stage sub-package S2-200. The second TMVs 230X' for connection of the second stage sub-package S2-200 may be electrically connected to a second semiconductor chip 220' in the second stage sub-package S2-200 through second RDL patterns 250'. The second TMVs 230X' for connection may be electrically connected to the first TMVs 230X for connection through first inner connectors 430X.

Each of the second TMVs 230X' for connection may have substantially the same shape and configuration as each of the first TMVs 230X for connection, and each of the second RDL patterns 250' may have substantially the same shape and configuration as each of the first RDL patterns 250. In addition, the second semiconductor chip 220' may have substantially the same shape and configuration as the first semiconductor chip 220.

The first TMVs 230X for connection of the first stage sub-package S1-200 may be electrically connected to first internal interconnection lines 560X disposed in the package substrate 500 through the first inner connectors 430X. The first TMVs 230X for connection of the first stage sub-package S1-200 may be electrically connected to first outer connectors 570X of the outer connectors 570 through the first internal interconnection lines 560X.

The first outer connectors 570X, the first internal interconnection lines 560X, the first inner connectors 430X, the first TMVs 230X for connection of the first stage sub-package S1-200, the second TMVs 230X' for connection of the second stage sub-package S2-200, and the second RDL patterns 250' may provide connection paths that are electrically connected to the second semiconductor chip 220'. In addition, the first outer connectors 570X, the first internal interconnection lines 560X, the first inner connectors 430X, the first TMVs 230X for connection of the first stage sub-package S1-200, and the first RDL patterns 250 may provide connection paths that are electrically connected to the first semiconductor chip 220.

The third TMVs 330X for bypass of the third stage sub-package S3-300 may be electrically connected to the second TMVs 230X' for connection of the second stage sub-package S2-200. The third TMVs 330X for bypass of the third stage sub-package S3-300 and fourth TMVs 330X' for bypass of the fourth stage sub-package S4-300 may correspond to dummy vias that are electrically disconnected from the third semiconductor chip 320 in the third stage sub-package S3-300 and a fourth semiconductor chip 320' in the fourth stage sub-package S4-300. Thus, the third semiconductor chip 320 embedded in the third stage sub-package S3-300 and the fourth semiconductor chip 320' embedded in the fourth stage sub-package S4-300 may be electrically disconnected from the first outer connectors 570X.

The first to fourth stage sub-package S1-200, S2-200, S3-300, and S4-300 may be stacked on the second surface 501 of the package substrate 500 such that the first surfaces 223, 223', 323, 323' of the first to fourth semiconductor chips 220, 220', 320, and 320', respectively, embedded in the first to fourth stage sub-package S1-200, S2-200, S3-300, and S4-300 face the same direction as the second surface 501 of the package substrate 500. In other words, the first to fourth semiconductor chips 220, 220', 320, and 320' may be stacked on the package substrate 500 with a face-up orientation.

Referring to FIG. 10, the third TMVs 330Y for connection of the third stage sub-package S3-300 may be electrically connected to the third semiconductor chip 320 by the third RDL patterns 350. That is, the third TMVs 330Y for connection and the third RDL patterns 350 may provide connection paths that are electrically connected to the third semiconductor chip 320. Similarly, fourth TMVs 330Y' for connection of the fourth stage sub-package S4-300 may be electrically connected to the fourth semiconductor chip 320' of the fourth stage sub-package S4-300 by fourth RDL patterns 350'. Each of the fourth TMVs 330Y' for connection may have substantially the same shape and configuration as each of the third TMVs 330Y for connection, and each of the fourth RDL patterns 350' may have substantially the same shape and configuration as each of the third RDL patterns 350. In addition, the fourth semiconductor chip 320' may have substantially the same shape and configuration as the third semiconductor chip 320.

The third TMVs 330Y for connection of the third stage sub-package S3-300 may be electrically connected to second TMVs 230Y' for bypass of the second stage sub-package S2-200 located below the third stage sub-package S3-300. The third TMVs 330Y for connection may be electrically connected to second TMVs 230Y' for bypass by second inner connectors 430Y. The second TMVs 230Y' for bypass of the second stage sub-package S2-200 may be electrically connected to the first TMVs 230Y for bypass of the first stage sub-package S1-200 located below the second stage sub-package S2-200 by the second inner connectors 430Y.

The first TMVs 230Y for bypass of the first stage sub-package S1-200 may be electrically connected to second internal interconnection lines 560Y disposed in the package substrate 500 through the second inner connectors 430Y. The first TMVs 230Y for bypass of the first stage sub-package S1-200 may be electrically connected to second outer connectors 570Y through the second inner connectors 430Y and the second internal interconnection lines 560Y.

The second outer connectors 570Y, the second internal interconnection lines 560Y, the second inner connectors 430Y, the first TMVs 230Y for bypass of the first stage sub-package S1-200, the second TMVs 230Y' for bypass of the second stage sub-package S2-200, the third TMVs 330Y for connection of the third stage sub-package S3-300, and the third RDL patterns 350 may provide connection paths that are electrically connected to the third semiconductor chip 320. In addition, the second outer connectors 570Y, the second internal interconnection lines 560Y, the second inner connectors 430Y, the first TMVs 230Y for bypass of the first stage sub-package S1-200, the second TMVs 230Y' for bypass of the second stage sub-package S2-200, the third TMVs 330Y for connection of the third stage sub-package S3-300, the fourth TMVs 330Y' for connection of the fourth stage sub-package S4-300, and the fourth RDL patterns 350' may provide connection paths that are electrically connected to the fourth semiconductor chip 320'.

The stack package 100 illustrated in FIGS. 9 and 10 may be configured to include the first to fourth stage sub-packages S1-200, S2-200, S3-300, and S4-300. However, in some other embodiments, the stack package 100 may be configured to include only two stages of sub-packages, for example, the first stage sub-package S1-200 and the third stage sub-package S3-300 without the second and fourth stage sub-packages S2-200 and S4-300.

FIGS. 9 and 10 illustrate the stack package 100 having a face-up shape. However, in some other embodiments, the first to fourth stage sub-package S1-200, S2-200, S3-300, and S4-300 may be stacked on the second surface 501 of the package substrate 500 such that the first surfaces 223, 223', 323, 323' of the first to fourth semiconductor chips 220, 220', 320, and 320', respectively, embedded in the first to fourth stage sub-package S1-200, S2-200, S3-300, and S4-300 face the same direction as the first surface 502 of the package substrate 500. That is, the first to fourth semiconductor chips 220, 220', 320, and 320' may be stacked on the package substrate 500 with a face-down orientation.

Referring to FIGS. 11 and 12, the stack package 1100 may be realized by flipping the first sub-package 200 of FIGS. 1 and 2 and stacking the flipped first sub-package 200 on the second surface 501 of the package substrate 500 and by flipping the third sub-package 300 of FIGS. 5 and 6 and stacking the flipped third sub-package 300 on the flipped first sub-package 200. For example, the stack package 1100 may be configured to include a first stage sub-package S5-200, a second stage sub-package S6-200, a third stage sub-package S7-300, and a fourth stage sub-package S8-300, which are sequentially stacked on the second surface 501 of the package substrate 500. The first to fourth stage sub-packages S5-200, S6-200, S7-300, and S8-300 may also be referred to as a first sub-package, a second sub-package, a third sub-package, and a fourth sub-package, respectively. The first to fourth stage sub-packages S5-200, S6-200, S7-300, and S8-300 illustrated in FIGS. 11 and 12 may correspond to flipped sub-packages of the first to fourth stage sub-packages S1-200, S2-200, S3-300, and S4-300 illustrated in FIGS. 9 and 10, respectively. That is, the stack package 1100 may have a face-down orientation.

Each of the first and second stage sub-packages S5-200 and S6-200 may be provided by flipping the first sub-package 200 illustrated in FIGS. 1 to 4. Each of the third and fourth stage sub-packages S7-300 and S8-300 may be provided by flipping the third sub-package 300 illustrated in FIGS. 5 to 8. Accordingly, the stack package 1100 may be realized by flipping the first sub-package 200 of FIGS. 1 and 2 and stacking the flipped first sub-package 200 twice on the second surface 501 of the package substrate 500 and by flipping the third sub-package 300 of FIGS. 5 and 6 and stacking the flipped third sub-package 300 twice on the flipped first sub-packages 200.

Referring to FIG. 11, the first TMVs 230X for connection of the first stage sub-package S5-200 may be electrically connected to the first semiconductor chip 220 in the first stage sub-package S5-200 by the first RDL patterns 250. In such a case, the first RDL patterns 250 of the first stage sub-package S5-200 may provide connection paths that are electrically connected to the first semiconductor chip 220.

The second TMVs 230X' for connection of the second stage sub-package S6-200 may be electrically connected to the first TMVs 230X for connection of the first stage sub-package S5-200 located below the second stage sub-package S6-200 by the second RDL patterns 250'. The second RDL patterns 250' of the second stage sub-package S6-200 may provide connection paths that are electrically connected to the second semiconductor chip 220'. The second RDL patterns 250' may be electrically connected to the first TMVs 230X for connection through the first inner connectors 430X. In addition, the second TMVs 230X' for connection may be electrically connected to the second semiconductor chip 220' and the first TMVs 230X for connection through the second RDL patterns 250'.

Each of the second TMVs 230X' for connection may have substantially the same shape and configuration as each of the first TMVs 230X for connection, and each of the second RDL patterns 250' may have substantially the same shape and configuration as each of the first RDL patterns 250. In addition, the second semiconductor chip 220' may have substantially the same shape and configuration as the first semiconductor chip 220. The second TMVs 230X' for connection may correspond to dummy vias that are not essential for electrically connecting the second semiconductor chip 220' to the first outer connectors 570X. Thus, the second TMVs 230X' for connection may be omitted in the second stage sub-package S6-200.

The first TMVs 230X for connection and the first RDL patterns 250 may be electrically connected to the first internal interconnection lines 560X of the package substrate 500 through the first inner connectors 430X. The first TMVs 230X for connection of the first stage sub-package S5-200 may be electrically connected to the first outer connectors 570X through the first inner connectors 430X and the first internal interconnection lines 560X of the package substrate 500.

The first outer connectors 570X, the first internal interconnection lines 560X, the first inner connectors 430X, the first TMVs 230X for connection of the first stage sub-package S1-200, and the second TMVs 230X' for connection of the second stage sub-package S2-200 may provide connection paths that are electrically connected to the second semiconductor chip 220'. In addition, the first outer connectors 570X, the first internal interconnection lines 560X, the first inner connectors 430X, and the first RDL patterns 250 of the first stage sub-package S1-200 may provide connection paths that are electrically connected to the first semiconductor chip 220.

The third TMVs 330X for bypass of the third stage sub-package S7-300 may be electrically connected to the second TMVs 230X' for connection of the second stage sub-package S6-200. The third TMVs 330X for bypass of the third stage sub-package S7-300 and the fourth TMVs 330X' for bypass of the fourth stage sub-package S8-300 may correspond to dummy vias that are electrically disconnected from the third semiconductor chip 320 in the third stage sub-package S7-300 and the fourth semiconductor chip 320' in the fourth stage sub-package S8-300. Thus, the third semiconductor chip 320 embedded in the third stage sub-package S7-300 and/or the fourth semiconductor chip 320' embedded in the fourth stage sub-package S8-300 may be omitted in the stack package 1100. As a result, the third semiconductor chip 320 imbedded in the third stage sub-package S7-300 and the fourth semiconductor chip 320' imbedded in the fourth stage sub-package S8-300 may be electrically disconnected from the first outer connectors 570X.

The first to fourth stage sub-package S5-200, S6-200, S7-300, and S8-300 may be stacked on the second surface 501 of the package substrate 500 such that the first surfaces 223, 223', 323, and 323' of the first to fourth semiconductor chips 220, 220', 320, and 320', respectively, embedded in the first to fourth stage sub-package S5-200, S6-200, S7-300, and S8-300 face the same direction as the first surface 502 of the package substrate 500. That is, the first to fourth semiconductor chips 220, 220', 320, and 320' may be stacked on the package substrate 500 with a face-down orientation.

Referring to FIG. 12, the third TMVs 330Y for connection of the third stage sub-package S7-300 may be electrically connected to the third semiconductor chip 320 in the third stage sub-package S7-300 by the third RDL patterns 350. The third RDL patterns 350 may substantially provide connection paths that are electrically connected to the third semiconductor chip 320 in the third stage sub-package S7-300. Similarly, the fourth TMVs 330Y' for connection of the fourth stage sub-package S8-300 may be electrically connected to the fourth semiconductor chip 320' of the fourth stage sub-package S8-300 by the fourth RDL patterns 350'. The fourth RDL patterns 350' may substantially provide connection paths that are electrically connected to the fourth semiconductor chip 320' in the fourth stage sub-package S8-300. In such a case, the third TMVs 330Y for connection of the third stage sub-package S7-300 may act as connection paths that electrically connect the fourth semiconductor chip 320' to the third RDL patterns 350.

Each of the fourth TMVs 330Y' for connection may have substantially the same shape and configuration as each of the third TMVs 330Y for connection, and each of the fourth RDL patterns 350' may have substantially the same shape and configuration as each of the third RDL patterns 350. In addition, the fourth semiconductor chip 320' may have substantially the same shape and configuration as the third semiconductor chip 320. The fourth TMVs 330Y' for connection of the fourth stage sub-package S8-300 may correspond to dummy vias that are not essential for providing connection paths that are electrically connected to the fourth semiconductor chip 320'. Thus, the fourth TMVs 330Y' for connection may be omitted in the fourth stage sub-package S8-300. However, if at least one sub-package is additionally stacked on the fourth stage sub-package S8-300 opposite to the third stage sub-package S7-300, the fourth TMVs 330Y' for connection may act as connection paths that are electrically connected to another semiconductor chip in the additional sub-package. Similarly, the second TMVs 230X' for connection illustrated in FIG. 11 may also act as members providing other connection paths.

The third TMVs 330Y for connection of the third stage sub-package S7-300 may be electrically connected to the second TMVs 230Y' for bypass of the second stage sub-package S6-200 located below the third stage sub-package S7-300. The third TMVs 330Y for connection may be electrically connected to the second TMVs 230Y' for bypass by the second inner connectors 430Y. The second TMVs 230Y' for bypass of the second stage sub-package S6-200 may be electrically connected to the first TMVs 230Y for bypass of the first stage sub-package S5-200 located below the second stage sub-package S6-200 by second the inner connectors 430Y.

The first TMVs 230Y for bypass of the first stage sub-package S5-200 may be electrically connected to the second internal interconnection lines 560Y disposed in the package substrate 500 through the second inner connectors 430Y. The first TMVs 230Y for bypass of the first stage sub-package S5-200 may be electrically connected to the second outer connectors 570Y through the second inner connectors 430Y and the second internal interconnection lines 560Y.

The second outer connectors 570Y, the second internal interconnection lines 560Y, the second inner connectors 430Y, the first TMVs 230Y for bypass of the first stage sub-package S5-200, the second TMVs 230Y' for bypass of the second stage sub-package S6-200, and the third RDL patterns 350 of the third stage sub-package S7-300 may provide connection paths that are electrically connected to the third semiconductor chip 320. In addition, the second outer connectors 570Y, the second internal interconnection lines 560Y, the second inner connectors 430Y, the first TMVs 230Y for bypass of the first stage sub-package S5-200, the second TMVs 230Y' for bypass of the second stage sub-package S6-200, the third TMVs 330Y for connection of the third stage sub-package S7-300, and the fourth RDL patterns 350' of the fourth stage sub-package S8-300 may provide connection paths that are electrically connected to the fourth semiconductor chip 320'.

In the stack package 1100 illustrated in FIGS. 11 and 12, the first stage sub-package S5-200 and the second stage sub-package S6-200 may be electrically connected to the first outer connectors 570X of the package substrate 500, and the first outer connectors 570X may provide a first channel for electrically and signally connecting the first and second stage sub-packages S5-200 and S6-200 to an external device or system. Moreover, in the stack package 1100, the third stage sub-package S7-300 and the fourth stage sub-package S8-300 may be electrically connected to the second outer connectors 570Y of the package substrate 500, and the second outer connectors 570Y may provide a second channel for electrically and signally connecting the third and fourth stage sub-packages S7-300 and S8-300 to an external device or system. In such a case, the first channel may function independently of the second channel.

Different embodiments may have different numbers of chips stacked in different orders with respect to their rotational orientations. Thus a stack of electrically connected TMVs spaced apart from the chips in the X-axis direction may electrically connect with a first group of chips and bypass a second group of remaining chips in the stack. A stack of electrically connected TMVs spaced apart from the chips in the Y-axis direction may electrically connect with the second group of chips and bypass the first group of chips.

Different embodiments may have different chip geometries and different relative angles of rotation between rotated chips. For example, square or rectangular four-sided chips may have a relative angle of rotation of 90 degrees, such that the Y-axis direction is rotated by 90 degrees from the X-axis direction. Hexagonal six-sided chips may have a relative angle of rotation of 60 degrees, such that the Y-axis direction is rotated by 60 degrees from the X-axis direction. Additionally, n-sided chips may have a relative angle of rotation of 360/n degrees between the X-axis direction and the Y-axis direction.

Referring to FIGS. 11, 12, and 13, the first outer connectors 570X may be disposed in two first regions 500G1 of the first surface 502 of the package substrate 500. In addition, the second outer connectors 570Y may be disposed in two second regions 500G2 of the first surface 502 of the package substrate 500. The two first regions 500G1 are distinct from the two second regions 500G2 in a plan view. The two first regions 500G1 may be disposed to be point symmetric with respect to a central point of the package substrate 500 in a plan view, and the two second regions 500G2 may also be disposed to be point symmetric with respect to a central point of the package substrate 500 in a plan view.

The first TMVs 230X for connection may be disposed to overlap with the first regions 500G1, and the first TMVs 230Y for bypass may be disposed to overlap with the second regions 500G2. Thus, the length of routes (i.e., electrical interconnection lines) between the first TMVs 230X for connection and the first outer connectors 570X may be reduced, and the length of routes (i.e., electrical interconnection lines) between the first TMVs 230Y for bypass and the second outer connectors 570Y may be reduced. Reduction of the length of the routes may lead to improved signal transmission speeds. In other embodiments, the first regions 500G1 and the second regions 500G2 may differ in geometry from the geometry illustrated by FIG. 13.

Figure 14:
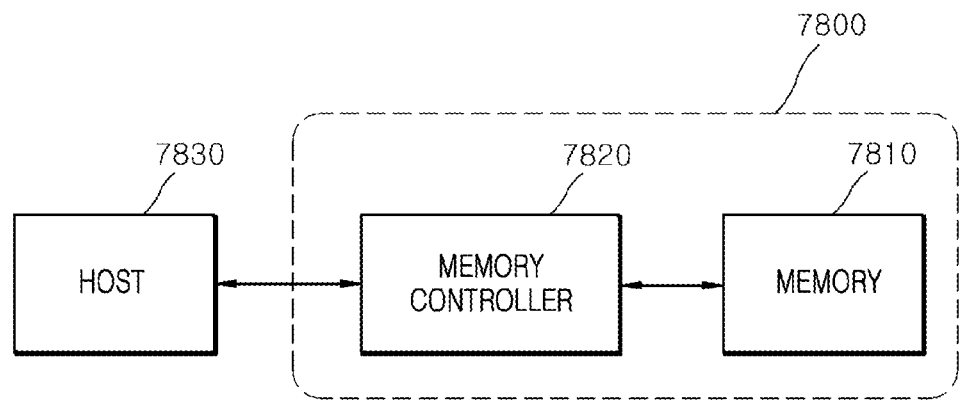
FIG. 14 show a block diagram illustrating an electronic system employing a memory card including at least one stack package, according to various embodiments.

FIG. 14 shows a block diagram illustrating an electronic system 7710 including a memory card 7800 employing at least one of the stack packages according to an embodiment of the present disclosure. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 15:
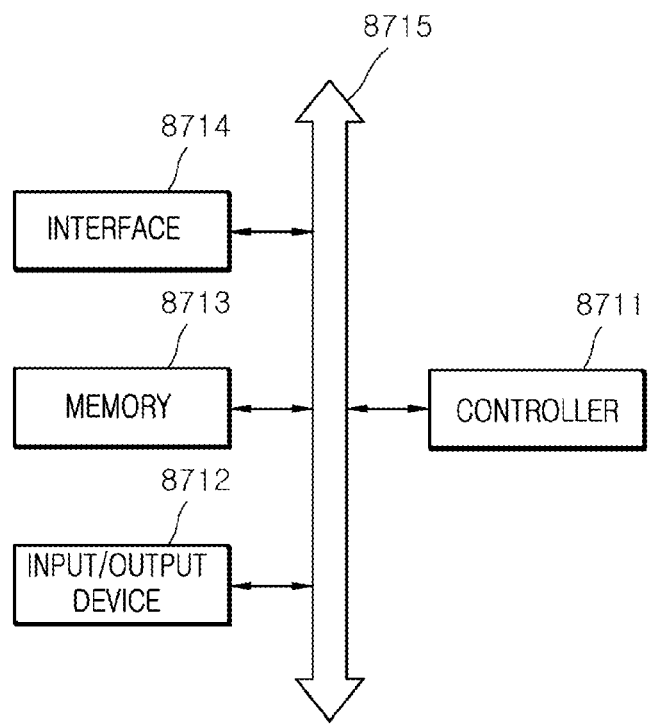
FIG. 15 shows a block diagram illustrating another electronic system including at least one stack package, according to various embodiments.

FIG. 15 shows a block diagram illustrating an electronic system 8710 including at least one of the stack packages according to an embodiment of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data can flow.

In an embodiment, the controller 8711 may include one or more of a microprocessor, a digital signal processor, a microcontroller, and/or a logic device capable of performing the same functions as these components. The controller 8711 and/or the memory 8713 may include one or more of the stack packages according to an embodiment of the present disclosure. The input/output device 8712 may include at least one of a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), or WiBro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A stack package comprising:
    a package substrate having a first surface to which a first outer connector and a second outer connector are attached;
    a first sub-package stacked on a second surface of the package substrate opposite to the first and second outer connectors, wherein the first sub-package comprises a first semiconductor chip, a first through mold via (TMV) for connection that is spaced apart from the first semiconductor chip in an X-axis direction and that is connected to the first outer connector through the package substrate, a first TMV for bypass that is spaced apart from the first semiconductor chip in a Y-axis direction and that is connected to the second outer connector through the package substrate, and a first redistribution line (RDL) pattern for connecting the first semiconductor chip to the first TMV for connection;
    a second sub-package stacked on the first sub-package opposite to the package substrate, wherein the second sub-package comprises a second semiconductor chip, a second TMV for bypass that is spaced apart from the second semiconductor chip in a Y-axis direction and that is connected to the first TMV for bypass, and a second RDL pattern for connecting the second semiconductor chip to the first TMV for connection;

a third sub-package stacked on the second sub-package opposite to the first sub-package, wherein the third sub-package comprises a third semiconductor chip and a third RDL pattern for connecting the third semiconductor chip to the second TMV for bypass; and a first inner connector disposed between the package substrate and the first sub-package to connect the first TMV for connection to the first outer connector and a second inner connector disposed between the package substrate and the first sub-package to connect the first TMV for bypass to the second outer connector.

2. The stack package of claim 1,
wherein the first sub-package further comprises a mold layer covering at least side surfaces of the first semiconductor chip and revealing a surface of the first semiconductor chip; and
wherein the first RDL pattern extends from a second surface of the mold layer onto the revealed surface of the first semiconductor chip.

3. The stack package of claim 2, wherein the revealed surface of the first semiconductor chip faces the second surface of the package substrate.

4. The stack package of claim 2, wherein both of the first TMV for connection and the first TMV for bypass substantially penetrate the mold layer to extend from the second surface of the mold layer to a first surface of the mold layer opposite to the first RDL pattern.

5. The stack package of claim 1, wherein the first TMV for bypass is electrically disconnected and isolated from the first semiconductor chip.

6. The stack package of claim 1,
wherein the second sub-package further comprises a second TMV for connection that is spaced apart from the second semiconductor chip in the X-axis direction and that is connected to the first TMV for connection; and
wherein the second RDL pattern extends to connect the second semiconductor chip to the second TMV for connection.

7. The stack package of claim 6, wherein the third sub-package further comprises a third TMV for bypass that is spaced apart from the third semiconductor chip in the X-axis direction and that is connected to the second TMV for connection.

8. The stack package of claim 7,
wherein the third sub-package further comprises a third TMV for connection that is spaced apart from the third semiconductor chip in the Y-axis direction and that is connected to the second TMV for bypass; and
wherein the third RDL pattern connects the third semiconductor chip to the third TMV for connection.

9. The stack package of claim 8, further comprising a fourth sub-package stacked on the third sub-package opposite to the second sub-package,
wherein the fourth sub-package comprises:
a fourth semiconductor chip;
a fourth TMV for bypass that is spaced apart from the fourth semiconductor chip in the X-axis direction and that is connected to the third TMV for bypass;
a fourth TMV for connection that is spaced apart from the fourth semiconductor chip in the Y-axis direction and that is connected to the third TMV for connection; and
a fourth RDL pattern for connecting the fourth semiconductor chip to the fourth TMV for connection.

10. The stack package of claim 1,
wherein the first RDL pattern comprises an extension pattern extending in the X-axis direction; and
wherein the third RDL pattern comprises an extension pattern extending in the Y-axis direction.

11. The stack package of claim 1, wherein the third semiconductor chip is rotated relative to the first semiconductor chip in an X-Y plane by an angle of substantially ninety degrees.

12. The stack package of claim 1, wherein the package substrate further comprises a first internal interconnection line that electrically connects the first inner connector to the first outer connector and a second internal interconnection line that electrically connects the second inner connector to the second outer connector.

13. The stack package of claim 1,
wherein the first surface of the package substrate comprises a first region in which the first outer connector is disposed and a second region in which the second outer connector is disposed;
wherein the first TMV for connection is disposed to overlap with the first region; and
wherein the first TMV for bypass is disposed to overlap with the second region.

14. A stack package comprising:
a package substrate having a first surface to which a first outer connector and a second outer connector are attached;
a first sub-package stacked on a second surface of the package substrate opposite to the first and second outer connectors, wherein the first sub-package comprises a first semiconductor chip, a first through mold via (TMV) for bypass that is spaced apart from the first semiconductor chip in a Y-axis direction and that is connected to the second outer connector through the package substrate, and a first redistribution line (RDL) pattern for connecting the first semiconductor chip to the first outer connector though the package substrate;
a third sub-package stacked over the first sub-package opposite to the package substrate, wherein the third sub-package comprises a third semiconductor chip and a third RDL pattern for connecting the third semiconductor chip to the first TMV for bypass; and
a first inner connector disposed between the package substrate and the first sub-package to connect the first TMV for connection to the first outer connector and a second inner connector disposed between the package substrate and the first sub-package to connect the first TMV for bypass to the second outer connector.

15. The stack package of claim 14, wherein the first sub-package further comprises a first TMV for connection that is spaced apart from the first semiconductor chip in an X-axis direction.

16. The stack package of claim 15, wherein the first RDL pattern connects the first semiconductor chip to the first TMV for connection.

17. The stack package of claim 16,
wherein the first sub-package further comprises a mold layer covering at least side surfaces of the first semiconductor chip and revealing a surface of the first semiconductor chip; and
wherein the first RDL pattern extends from a second surface of the mold layer onto the revealed surface of the first semiconductor chip.

18. The stack package of claim 17, wherein both of the first TMV for connection and the first TMV for bypass substantially penetrate the mold layer to extend from the second surface of the mold layer to a first surface of the mold layer opposite to the first RDL pattern.

19. A stack package comprising:
a package substrate having a first surface to which a first outer connector and a second outer connector are attached;
a first sub-package stacked on a second surface of the package substrate opposite to the first and second outer connectors, wherein the first sub-package comprises a first semiconductor chip, a mold layer covering side surfaces of the first semiconductor chip and having a second surface that reveals a first surface of the first semiconductor chip facing the same direction as the second surface of the package substrate, a first through mold via (TMV) for connection that is spaced apart from the first semiconductor chip in an X-axis direction and that penetrates the mold layer to connect with the first outer connector through the package substrate, a first TMV for bypass that is spaced apart from the first semiconductor chip in a Y-axis direction and that penetrates the mold layer to connect with the second outer connector through the package substrate, and a first redistribution line (RDL) pattern that extends from the second surface of the mold layer onto the first surface of the first semiconductor chip to connect the first semiconductor chip to the first TMV for connection;
a second sub-package stacked on the first sub-package opposite to the package substrate, wherein the second sub-package comprises a second semiconductor chip, a second TMV for bypass that is spaced apart from the second semiconductor chip in the Y-axis direction and that is connected to the first TMV for bypass, and a second RDL pattern for connecting the second semiconductor chip to the first TMV for connection; and
a third sub-package stacked on the second sub-package opposite to the first sub-package, wherein the third sub-package comprises a third semiconductor chip and a third RDL pattern for connecting the third semiconductor chip to the second TMV for bypass; and
a first inner connector disposed between the package substrate and the first sub-package to connect the first TMV for connection to the first outer connector and a second inner connector disposed between the package substrate and the first sub-package to connect the first TMV for bypass to the second outer connector.

* * * * *